United States Patent
Lee et al.

(10) Patent No.: US 12,247,289 B2
(45) Date of Patent: Mar. 11, 2025

(54) METHOD FOR FORMING THIN FILM USING SURFACE PROTECTION MATERIAL

(71) Applicant: EGTM CO., LTD., Suwon-si (KR)

(72) Inventors: Geun Su Lee, Suwon-si (KR); Jae Min Kim, Bucheon-si (KR); Ha Na Kim, Suwon-si (KR); Woong Jin Choi, Suwon-si (KR)

(73) Assignee: EGTM CO., LTD., Suwon-si (KR)

( * ) Notice: Subject to any disclaimer, the term of this patent is extended or adjusted under 35 U.S.C. 154(b) by 52 days.

(21) Appl. No.: 17/776,751

(22) PCT Filed: Nov. 16, 2020

(86) PCT No.: PCT/KR2020/016102
§ 371 (c)(1),
(2) Date: May 13, 2022

(87) PCT Pub. No.: WO2021/096326
PCT Pub. Date: May 20, 2021

(65) Prior Publication Data
US 2022/0403521 A1    Dec. 22, 2022

(30) Foreign Application Priority Data
Nov. 15, 2019    (KR) .......................... 10-2019-0146643

(51) Int. Cl.
*C23C 16/52*    (2006.01)
*C23C 16/02*    (2006.01)
(Continued)

(52) U.S. Cl.
CPC .......... *C23C 16/52* (2013.01); *C23C 16/0272* (2013.01); *C23C 16/403* (2013.01);
(Continued)

(58) Field of Classification Search
CPC ... C23C 16/52; C23C 16/0272; C23C 16/403; C23C 16/4408; C23C 16/455; C23C 16/45527
See application file for complete search history.

(56) References Cited

U.S. PATENT DOCUMENTS

| | | | |
|---|---|---|---|
| 2010/0036144 A1 | 2/2010 | Ma et al. | |
| 2017/0040172 A1* | 2/2017 | Moon | ............... C23C 16/45544 |
| 2019/0304770 A1* | 10/2019 | Park | ...................... H01L 29/775 |

FOREIGN PATENT DOCUMENTS

| | | |
|---|---|---|
| JP | 2003-231738 A | 8/2003 |
| KR | 10-2005-0081022 A | 8/2005 |

(Continued)

OTHER PUBLICATIONS

ECHA. 1,2-dimethoxyethane, Jun. 9, 2023. ECHA https://echa.europa.eu/brief-profile/-/briefprofile/100.003.451 (Year: 2023).*

*Primary Examiner* — Dah-Wei D. Yuan
*Assistant Examiner* — Kristen A Dagenais
(74) *Attorney, Agent, or Firm* — Rabin & Berdo, P.C.

(57) ABSTRACT

According to one embodiment of the present invention, a method for forming a thin film using a surface protection material comprises: a surface protection layer forming step of forming a surface protection layer on the surface of a substrate by supplying a surface protection material to the inside of a chamber in which the substrate is placed; a step of performing a primary purging of the inside of the chamber; a metal precursor supply step of supplying a metal precursor to the inside of the chamber; a step of performing a secondary purging of the inside of the chamber; and a thin film forming step of supplying a reactive material to the inside of the chamber so as to react with the metal precursor and form a thin film.

4 Claims, 4 Drawing Sheets

(51) Int. Cl.
*C23C 16/40* (2006.01)
*C23C 16/44* (2006.01)
*C23C 16/455* (2006.01)

(52) U.S. Cl.
CPC ........ *C23C 16/4408* (2013.01); *C23C 16/455* (2013.01); *C23C 16/45527* (2013.01)

(56) References Cited

FOREIGN PATENT DOCUMENTS

| KR | 10-2017-0016748 | A | 2/2017 |
| KR | 10-2018-0114536 | A | 10/2018 |
| KR | 10-2095710 | B1 | 4/2020 |

* cited by examiner

METHOD FOR FORMING THIN FILM USING SURFACE PROTECTION MATERIAL

TECHNICAL FIELD

The present invention relates to a method for forming thin film, and more particularly, to a method for forming a thin film in which the thickness and the step coverage of the thin film can be easily controlled by forming a thin film having a very thin thickness.

BACKGROUND ART

DRAM devices continue to be miniaturized with the development of innovative technologies, reaching the 10 nm era. Accordingly, in order to improve performance and reliability, high capacitance and low leakage current characteristics must be sufficiently maintained even when the size of the capacitor is reduced, and a breakdown voltage must be high.

When a single zirconium oxide film is used as the dielectric film of the conventional MIM capacitor, the equivalent oxide film thickness characteristic (Toxeq) is good, but the leakage current characteristic is weak. To overcome this problem, a combined high dielectric layer such as ZrO2/Al2O3/ZrO2 is widely used.

However, since this dielectric layer is thicker than a single ZrO2 dielectric layer, Toxeq characteristics are not good. In addition, Al2O3 of the ZAZ structure prevents leakage current of the capacitor. If the thickness is too large, the capacitance decreases, and if the thickness is too small, the leakage current increases. Therefore, proper thickness control is required.

Therefore, in order to maintain constant capacitance and leakage characteristics, it is necessary to develop a material suitable for the characteristics as well as to make the capacitor dielectric film ultra-thin.

DISCLOSURE OF THE INVENTION

Technical Problem

An object of the present invention is to provide a method for forming a very thin film.

Another object of the present invention is to provide a method for forming a thin film having good step coverage.

Other objects of the present invention will become more apparent from the following detailed description.

Technical Solution

In accordance with an exemplary embodiment of the present invention, a method of forming a thin film using a surface protection material having a plurality of ether groups, the method comprising: supplying a metal precursor to the inside of a chamber in which a substrate is placed so that the metal precursor is adsorbed to the substrate; purging the interior of the chamber; and supplying a reaction material to the inside of the chamber so that the reaction material reacts with the adsorbed metal precursor to form the thin film, wherein before forming the thin film, the method further comprises: supplying the surface protection material to the inside of the chamber so that the surface protection material is adsorbed to the substrate; and purging the interior of the chamber.

The surface protection material may be represented by the following Chemical Formula 1:

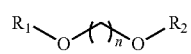

<Chemical Formula 1> in <Chemical Formula 1>, n is an integer of 0 to 5,
R1 and R2 are selected from an alkyl group having 1 to 10 carbon atoms, a cycloalkyl group having 1 to 10 carbon atoms, and an aryl group having 6 to 12 carbon atoms.

The surface protection material may be represented by the following Chemical Formula 2:

<Chemical Formula 2> in <Chemical Formula 2>, n is an integer of 0 to 5, m is an integer of 1 to 5,
R is selected from a plurality of ether functional groups including an alkyl group having 1 to 10 carbon atoms, a cycloalkyl group having 1 to 10 carbon atoms, and an aryl group having 6 to 12 carbon atoms.

The surface protection material may be represented by the following Chemical Formula 3:

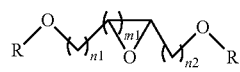

<Chemical Formula 3> in <Chemical Formula 3>, n1 and n2 are integers of 0 to 5, m1 and m2 are integers of 1 to 5,
R is selected from a plurality of ether functional groups including an alkyl group having 1 to 10 carbon atoms, a cycloalkyl group having 1 to 10 carbon atoms, and an aryl group having 6 to 12 carbon atoms.

The reaction material may be selected from O3, O2 and H2O.

The metal precursor may be a compound including at least one of a trivalent metal containing Al, a tetravalent metal containing Zr or Hf, and a pentavalent metal containing Nb or Ta.

The metal precursor may be represented by the following Chemical Formula 4:

<Chemical Formula 4> in <Chemical Formula 4>, R1, R2 and R3 are different from each other and each independently selected from an alkyl group having 1 to 6 carbon atoms, a dialkylamine group having 1 to 6 carbon atoms, or a cycloamine group having 1 to 6 carbon atoms.

Advantageous Effects

According to an embodiment of the present invention, it is possible to form a thin film with high purity without impurities and thinner than the thickness of one monolayer obtainable by the conventional ALD process. Since it has a very low thin film growth rate, it is easy to adjust the thickness of the thin film, and it is possible to control the step coverage, as well as to improve the electrical characteristics and reliability of the device.

BEST MODE

Hereinafter, preferred embodiments of the present invention will be described in more detail with reference to FIGS. 1 to 7. The present invention may be embodied in different forms and should not be constructed as limited to the embodiments set forth herein. Rather, the embodiments are provided to explain the present invention more completely to those skilled in the art to which the present invention pertains. Therefore, the dimensions of each component shown in the figures are exaggerated for clarity of description.

In the conventional deposition process using a single precursor in a trench structure having a high aspect ratio (for example, 40:1 or more), a thin film deposited on an upper part(or an entrance) of the trench becomes thicker, and a thin film deposited on a lower part(or a bottom) of the trench becomes thinner. Therefore, the step coverage of the thin film is poor and not uniform.

However, the surface protection material described below behaves in the same manner as the metal precursor, and the surface protection material is adsorbed at a higher density in the upper part of the trench than in the lower part of the trench to impede the adsorption of the metal precursor in a subsequent process, therefore the metal precursor reacts with a reaction material to form the thin film having an uniform thickness in the trench.

Figure 1:
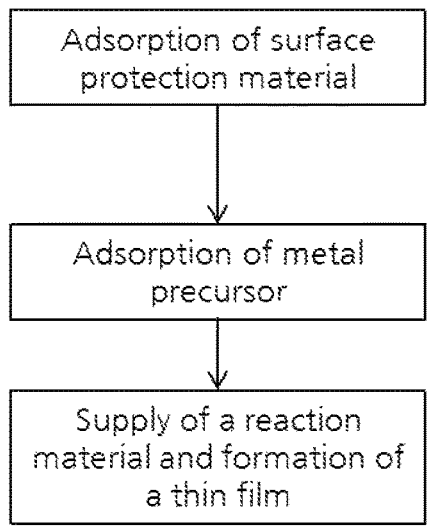
FIG. 1 is a flowchart schematically demonstrating a method of forming a thin film according to an embodiment of the present invention.
Figure 2:
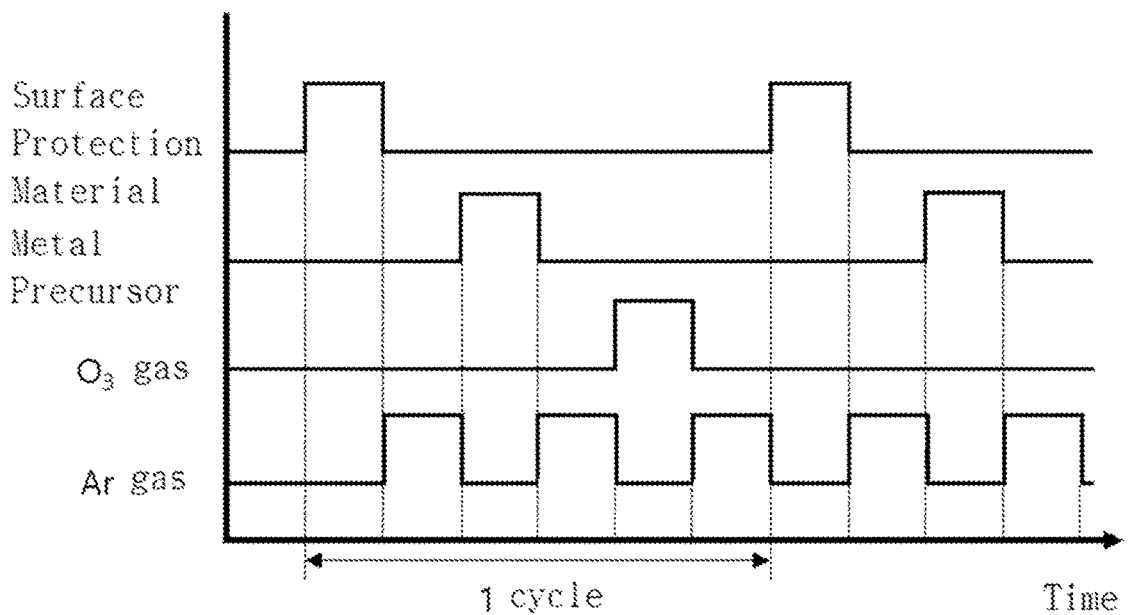
FIG. 2 is a graph schematically demonstrating a supply cycle according to an embodiment of the present invention.

FIG. 1 is a flowchart schematically demonstrating a method of forming a thin film according to an embodiment of the present invention, FIG. 2 is a graph schematically demonstrating a supply cycle according to an embodiment of the present invention. A substrate is loaded into a process chamber, and following ALD process conditions are adjusted. ALD process conditions may include a temperature of the substrate or process chamber, a pressure in the process chamber, gas flow rate, and the temperature is 50 to 600° C.

The substrate is exposed to the surface protection material supplied to the interior of the chamber, and the surface protection material is adsorbed to the surface of the substrate. The surface protection material has a similar behavior to the metal precursor during the deposition process, in case of a trench structure having a high aspect ratio (for example, 40:1 or more), so that it is adsorbed at a high density in the entrance of the trench and at a low density in the bottom of the trench to impede the adsorption of the metal precursor in a subsequent process.

In accordance with an exemplary embodiment of the present invention, a method of forming a thin film using a surface protection material having a plurality of ether groups, the method comprising: supplying a metal precursor to the inside of a chamber in which a substrate is placed so that the metal precursor is adsorbed to the substrate; purging the interior of the chamber; and supplying a reaction material to the inside of the chamber so that the reaction material reacts with the adsorbed metal precursor to form the thin film, wherein before forming the thin film, the method further comprises: supplying the surface protection material to the inside of the chamber so that the surface protection material is adsorbed to the substrate; and purging the interior of the chamber.

A surface protection material has a plurality of ether groups and is represented by the following Chemical Formula 1:

<Chemical Formula 1> in <Chemical Formula 1>, n is an integer of 0 to 5,
R1 and R2 are selected from an alkyl group having 1 to 10 carbon atoms, a cycloalkyl group having 1 to 10 carbon atoms, and an aryl group having 6 to 12 carbon atoms.

Also, the surface protection material may be represented by the following Chemical Formula 2:

<Chemical Formula 2> in <Chemical Formula 2>, n is an integer of 0 to 5, m is an integer of 1 to 5,
R is selected from a plurality of ether functional groups including an alkyl group having 1 to 10 carbon atoms, a cycloalkyl group having 1 to 10 carbon atoms, and an aryl group having 6 to 12 carbon atoms.

Also, the surface protection material may be represented by the following Chemical Formula 3:

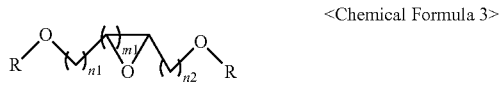

<Chemical Formula 3> in <Chemical Formula 3>, n1 and n2 are integers of 0 to 5, m1 and m2 are integers of 1 to 5, R is selected from a plurality of ether functional groups including an alkyl group having 1 to 10 carbon atoms, a cycloalkyl group having 1 to 10 carbon atoms, and an aryl group having 6 to 12 carbon atoms.

Thereafter, a purge gas (for example, an inert gas such as Ar) is supplied to the interior of the chamber to discharge the unadsorbed surface protection material or by-products.

Thereafter, the substrate is exposed to a metal precursor supplied to the interior of the chamber, and the metal precursor is adsorbed on the surface of the substrate. The metal precursor may include a group III element such as Al, a group IV element such as Zr, Hf, or a group V element such as Nb or Ta.

Also, the metal precursor may be represented by the following Chemical Formula 4:

<Chemical Formula 4>

in <Chemical Formula 4>, R1, R2 and R3 are different from each other and each independently selected from an alkyl group having 1 to 6 carbon atoms, a dialkylamine group having 1 to 6 carbon atoms, or a cycloamine group having 1 to 6 carbon atoms.

For example, the surface protection material described above is adsorbed in the entrance of the trench more densely than in the bottom of the trench, and the metal precursor cannot be adsorbed at the position where the surface protection material is adsorbed. That is, in the conventional deposition process, the metal precursor is adsorbed in the entrance of the trench more densely than in the bottom of the trench to have a high density in the entrance of the trench. But, in the present invention, the surface protection material is adsorbed in the entrance of the trench more densely than in the bottom of the trench to impede the adsorption of the metal precursor in the entrance of the trench, therefore, the metal precursor can be uniformly adsorbed in the trench without over-adsorption on the entrance of the trench, and the step coverage of the thin film described below can be improved.

Thereafter, a purge gas (for example, an inert gas such as Ar) is supplied to the interior of the chamber to discharge the unadsorbed metal precursors or by-products.

Thereafter, the substrate is exposed to a reaction material supplied to the interior of the chamber, and a thin film is formed on the surface of the substrate. The reaction material reacts with the metal precursor to form the thin film, and the reaction material may be water vapor (H2O), oxygen (O2) and ozone (O3). A metal oxide film may be formed by the reaction. At this time, the reaction material oxidizes the adsorbed surface protection material, and the adsorbed surface protection material may be separated and removed from the surface of the substrate.

Thereafter, a purge gas (for example, an inert gas such as Ar) is supplied to the interior of the chamber to discharge the surface protective material/unreacted material or by-products.

On the other hand, it was previously described that the surface protection material is supplied before the metal precursor. Alternatively, the surface protection material may be supplied after the metal precursor or the metal precursor may be supplied both before and after the surface protection material.

Comparative Example 1

An aluminium oxide film was formed on the silicon substrate without using the surface protection material described above. An aluminium oxide film was formed through the ALD process, the process temperature was 250 to 350° C., and the reaction material was ozone gas (O3).

The process of forming the aluminium oxide film through the ALD process is as follows, and the following process is performed as one cycle.

1) Ar is used as a carrier gas, the aluminium precursor TMA(Trimethylaluminium) is supplied to the reaction chamber at room temperature, and the aluminium precursor is adsorbed onto the substrate.
2) Ar gas is supplied into the reaction chamber to discharge unadsorbed aluminium precursors or byproducts.
3) Monolayer is formed by supplying ozone gas (O3) to the reaction chamber.
4) Ar gas is supplied into the reaction chamber to discharge unreacted substances or by-products.

As a result of measuring the thickness of the aluminium oxide film obtained by the above process, the thickness of the aluminium oxide film obtained for each cycle of the ALD process was about 1.0 Å/cycle at 300 to 350° C.

Figure 3:
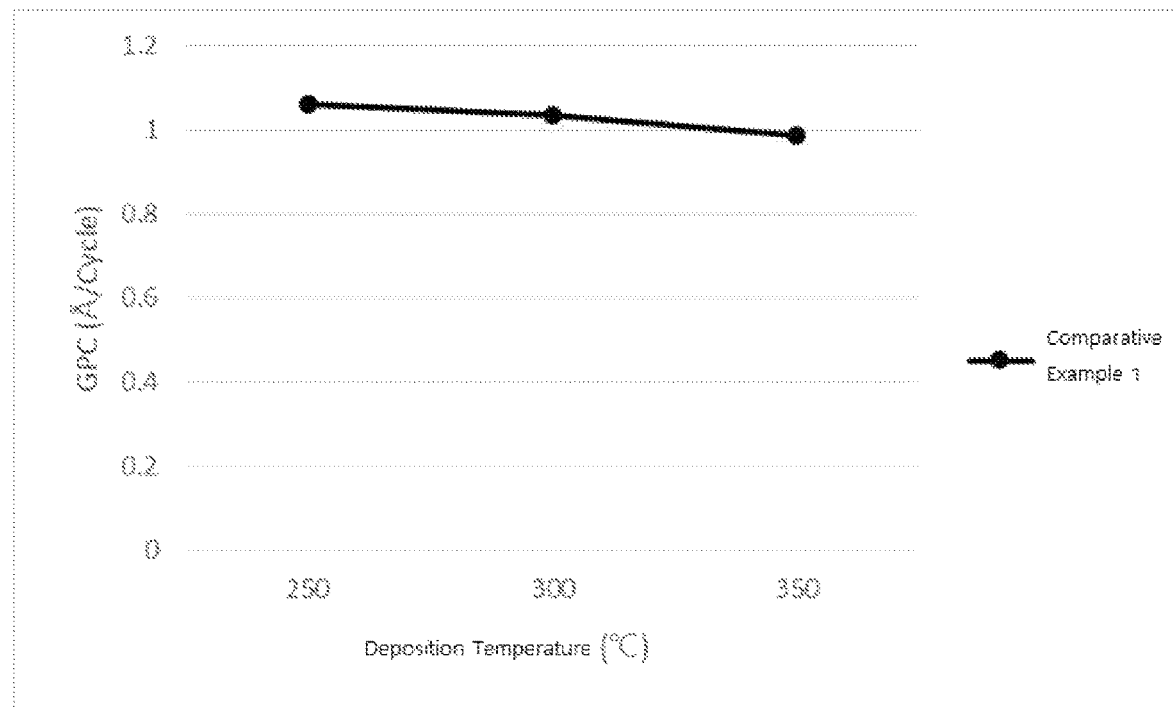
FIG. 3 is a graph demonstrating a GPC of the aluminium oxide film according to the process temperature, according to the Comparative Example 1 of the present invention.

FIG. 3 is a graph demonstrating a GPC of the aluminium oxide film according to the process temperature, according to the Comparative Example 1 of the present invention. As shown in FIG. 3, an ideal ALD behavior is shown with little change in GPC according to an increase in the temperature of the substrate within the range of 250 to 350° C. of the substrate temperature.

Figure 4:
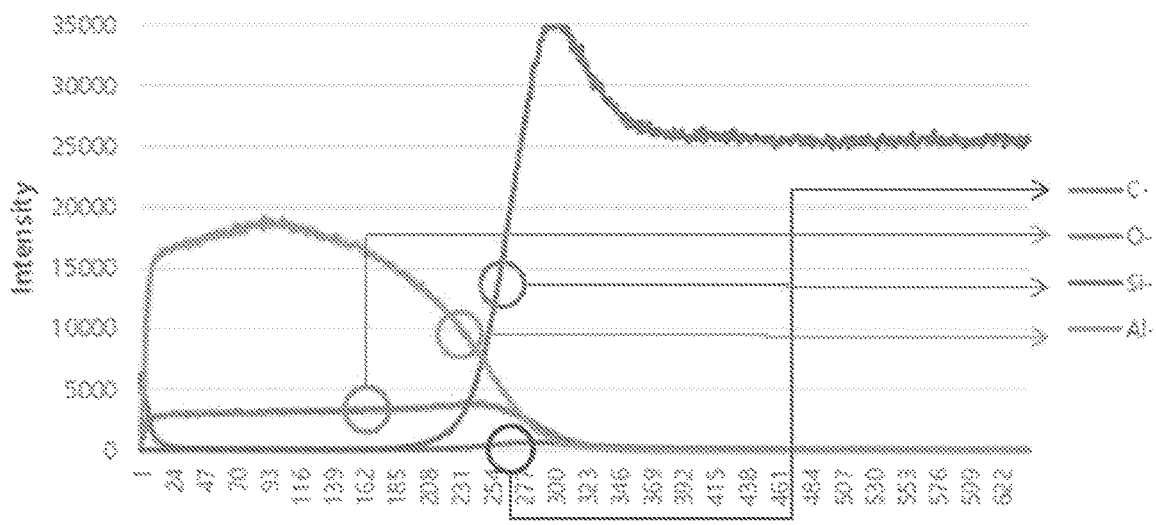
FIG. 4 is a graph demonstrating a SIMS(Secondary Ion Mass Spectroscopy) for analyzing the surface of an aluminum oxide film according to Comparative Example 1 of the present invention.

FIG. 4 is a graph demonstrating a SIMS(Secondary Ion Mass Spectroscopy) for analyzing the surface of an aluminum oxide film according to Comparative Example 1 of the present invention. As shown in FIG. 4, it was confirmed that impurities (eg, carbon atoms) derived from TMA, which is an aluminum precursor, did not remain in the oxide film.

Comparative Example 2

An aluminium oxide film was formed on the silicon substrate using a material having one ether group as a surface protection material. An aluminium oxide film was formed through the ALD process, the process temperature was 250 to 350° C., and the reaction material was ozone gas (O3).

The process of forming the aluminium oxide film through the ALD process is as follows, and the following process is performed as one cycle.

1) A surface protection material is supplied to the reaction chamber to be adsorbed onto the substrate.
2) Ar gas is supplied into the reaction chamber to discharge unadsorbed surface protection materials or by-products.
3) Ar is used as a carrier gas, the aluminium precursor TMA(Trimethylaluminium) is supplied to the reaction chamber at room temperature, and the aluminium precursor is adsorbed onto the substrate.
4) Ar gas is supplied into the reaction chamber to discharge unadsorbed aluminium precursors or byproducts.
5) Monolayer is formed by supplying ozone gas (O3) to the reaction chamber.
6) Ar gas is supplied into the reaction chamber to discharge unreacted substances or by-products.

As a result of using a material having one ether group as the surface protection material, the GPC reduction rates were 10.42% and 13.81% at 320° C. and 350° C., respectively. In conclusion, when a material having one ether group was used as a surface protection material, a low GPC reduction rate of about 10 to 13% was shown.

Example 1

A aluminium oxide film was formed on a silicon substrate in the same manner as in Comparative Example 2, except that the surface protection material was changed from a material having one ether group to MTHP(Methoxy Tetrahydropyran) having a plurality of ether groups.

Figure 5:
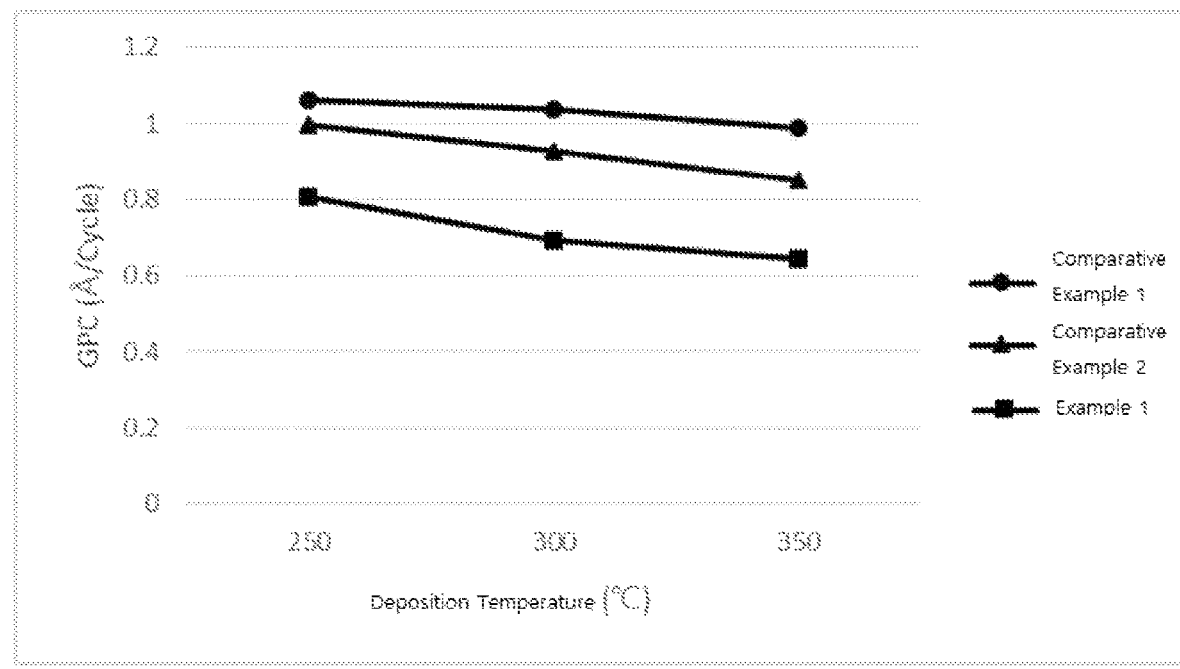
FIG. 5 is a graph demonstrating a GPC of the aluminium oxide film according to the process temperature, according to the Comparative Example 1, 2 and the Example 1 of the present invention.

FIG. 5 is a graph demonstrating a GPC of the aluminium oxide film according to the process temperature, according to the Comparative Example 1, 2 and the Example 1 of the present invention. As a result of using MTHP as a surface protection material, the GPC reduction rates were 33.19% and 34.78% at 300° C. and 350° C., respectively. In conclusion, when a material having a plurality of ether groups was used as a surface protection material, a high GPC reduction rate of about 33 to 34% was shown. In the case of a surface protection material having a plurality of ether groups, compared to a surface protection material having a single ether group, it is considered that the adsorption force with the substrate is increased (or density is increased), thereby showing a high GPC reduction effect.

Figure 6:
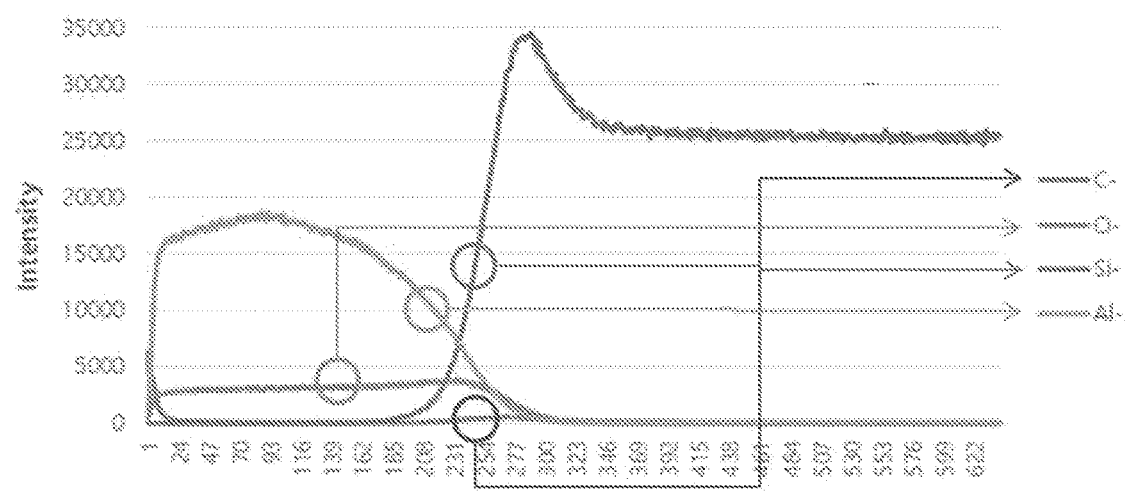
FIG. 6 is a graph demonstrating a SIMS(Secondary Ion Mass Spectroscopy) for analyzing the surface of an aluminum oxide film according to Example 1 of the present invention.

FIG. 6 is a graph demonstrating a SIMS(Secondary Ion Mass Spectroscopy) for analyzing the surface of an aluminum oxide film according to Example 1 of the present invention. As shown in FIG. 6, it was confirmed that impurities (eg, carbon atoms) derived from TMA as an aluminum precursor and a surface protection material did not remain in the oxide film.

Example 2

A aluminium oxide film was formed on a silicon substrate in the same manner as in Comparative Example 2, except that the surface protection material was changed from MTHP to MMTHF(Methoxymethyl Tetrahydrofuran).

Figure 7:
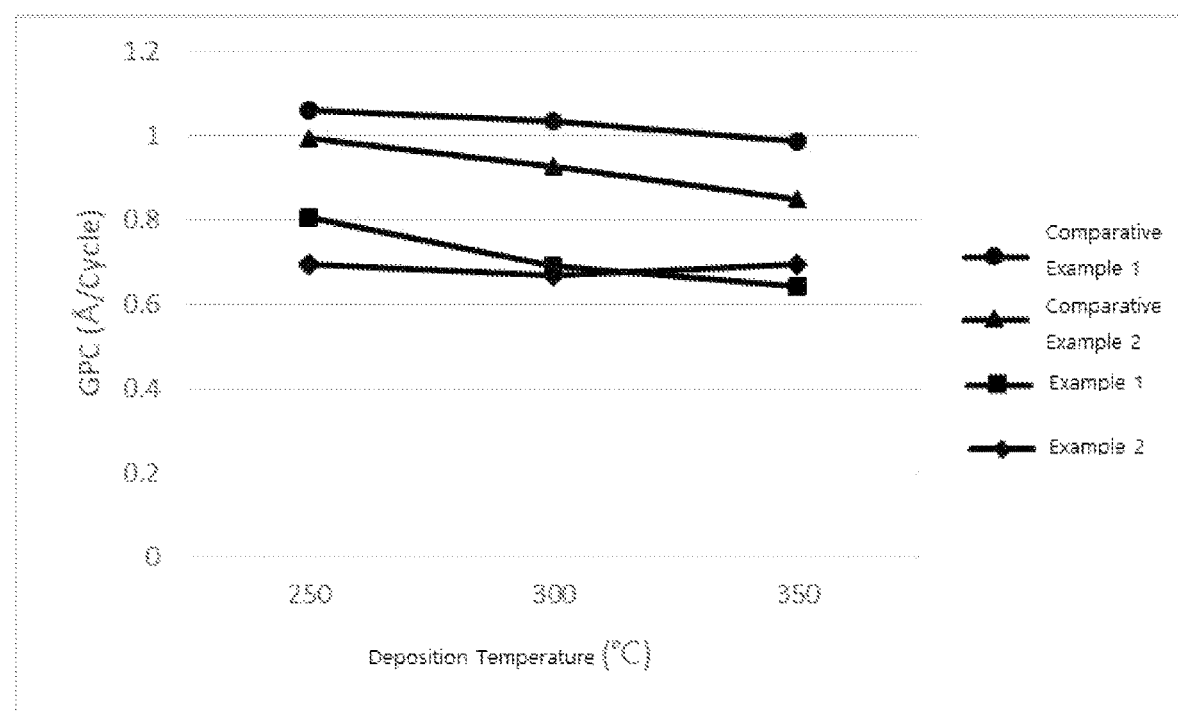
FIG. 7 is a graph demonstrating a GPC of the aluminium oxide film according to the process temperature, according to the Comparative Example 1, 2 and the Example 1, 2 of the present invention.

FIG. 7 is a graph demonstrating a GPC of the aluminium oxide film according to the process temperature, according to the Comparative Example 1, 2 and the Example 1, 2 of the present invention. As a result of using MMTHF as a surface protection material, the GPC reduction rates were 35.35% and 29.86% at 300° C. and 350° C., respectively. In conclusion, when a material having MMTHF was used as a surface protection material, a high GPC reduction rate of about 29 to 35% was shown.

In conclusion, the surface protection material shows a high GPC reduction effect through high adsorption performance, and through this, it is possible to form a thin film with high purity without impurities and thinner than the thickness of one monolayer obtainable by the conventional ALD process. In addition, since it has a very low growth rate of the thin film, it is easy to control the thickness of the thin film, it is possible to control step coverage, and it is possible to improve the electrical characteristics and reliability of the device.

Although the present invention is described in detail with reference to the exemplary embodiments, the invention may be embodied in many different forms. Thus, technical idea and scope of claims set forth below are not limited to the preferred embodiments.

INDUSTRIAL APPLICABILITY

The present invention may be applicable to a various method for manufacturing semiconductor.

What is claimed is:

1. A method of forming a thin film using a surface protection material having a plurality of ether groups, the method comprising:
supplying a metal precursor to the inside of a chamber in which a substrate is placed so that the metal precursor is adsorbed to the substrate;
purging the interior of the chamber; and
supplying a reaction material to the inside of the chamber so that the reaction material reacts with the adsorbed metal precursor to form the thin film,
wherein before forming the thin film, the method further comprises:
supplying the surface protection material to the inside of the chamber so that the surface protection material is adsorbed to the substrate; and
purging the interior of the chamber,
wherein the surface protection material is represented by the following Chemical Formula 3:

<Chemical Formula 3>

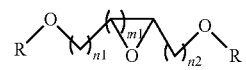

in <Chemical Formula 3>, n1 and n2 are integers of 0 to 5, m1 is an integer of 1 to 5,
R is selected from a plurality of ether functional groups including an alkyl group having 1 to 10 carbon atoms, a cycloalkyl group having 1 to 10 carbon atoms, and an aryl group having 6 to 12 carbon atoms.

2. The method of claim 1, wherein the reaction material is selected from $O_3$, $O_2$ and $H_2O$.

3. The method of claim 1, wherein the metal precursor is a compound including at least one of a trivalent metal containing Al, a tetravalent metal containing Zr or Hf, and a pentavalent metal containing Nb or Ta.

4. The method of claim 1, wherein the metal precursor is represented by the following Chemical Formula 4:

<Chemical Formula 4>

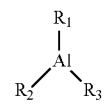

in <Chemical Formula 4>, $R_1$, $R_2$ and $R_3$ are different from each other and each independently selected from an alkyl group having 1 to 6 carbon atoms, a dialkylamine group having 1 to 6 carbon atoms, or a cycloamine group having 1 to 6 carbon atoms.

* * * * *